(12) United States Patent
Chen et al.

(10) Patent No.: US 11,347,268 B2
(45) Date of Patent: May 31, 2022

(54) ELECTRONIC APPARATUS, SUPPORT FOR SUPPORTING FLEXIBLE DISPLAY PANEL IN ELECTRONIC APPARATUS, AND METHOD OF FABRICATING ELECTRONIC APPARATUS

(71) Applicants: Chengdu BOE Optoelectronics Technology Co., Ltd., Sichuan (CN); BOE Technology Group Co., Ltd., Beijing (CN)

(72) Inventors: Yu Chen, Beijing (CN); Kun Ma, Beijing (CN); Ruilin Wang, Beijing (CN); Run Gao, Beijing (CN); Dingdong Song, Beijing (CN); Mao Li, Beijing (CN); Wei Zeng, Beijing (CN); Chao Yin, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 420 days.

(21) Appl. No.: 16/466,638

(22) PCT Filed: Nov. 21, 2018

(86) PCT No.: PCT/CN2018/116741
§ 371 (c)(1),
(2) Date: Jun. 4, 2019

(87) PCT Pub. No.: WO2020/000881
PCT Pub. Date: Jan. 2, 2020

(65) Prior Publication Data
US 2021/0356993 A1    Nov. 18, 2021

(30) Foreign Application Priority Data

Jun. 29, 2018  (CN) .......................... 201810713487.6

(51) Int. Cl.
*G06F 1/16*    (2006.01)
*H01L 51/00*   (2006.01)

(52) U.S. Cl.
CPC .......... *G06F 1/1652* (2013.01); *G06F 1/1656* (2013.01); *H01L 51/0097* (2013.01)

(58) Field of Classification Search
CPC .... G06F 1/1652; G06F 1/1656; G06F 1/1626; G06F 1/1637; H01L 51/0097; Y02E 10/549; G09F 9/301; G09F 9/33
See application file for complete search history.

(56) References Cited

U.S. PATENT DOCUMENTS 9,515,099 B2 * 12/2016 Kwon .................. H01L 27/1222
9,952,459 B2 *  4/2018 Chien ................ G02F 1/133308
(Continued)

FOREIGN PATENT DOCUMENTS

CN    103309499 A    9/2013
CN    103547109 A    1/2014
(Continued)

OTHER PUBLICATIONS

Translation of Foreign art CN107068862A (foreign copy provided in the IDS) (Year: 2017).*
(Continued)

*Primary Examiner* — Abhishek M Rathod
(74) *Attorney, Agent, or Firm* — Intellectual Valley Law, P.C.

(57) ABSTRACT

An electronic apparatus. The electronic apparatus includes a flexible display panel and a support for supporting the flexible display panel. The flexible display panel has a display area and a peripheral area, and an edge groove in the peripheral area defining an edge portion of the flexible display panel. The edge portion being on a side of the edge groove distal to the display area. The support has a first
(Continued)

support groove configured to receive the edge portion of the flexible display panel. The flexible display panel is bent about the edge groove, facilitating insertion of the edge portion of the flexible display panel into the first support groove.

19 Claims, 6 Drawing Sheets

(56) References Cited

U.S. PATENT DOCUMENTS

| | | | | |
|---|---|---|---|---|
| 9,977,467 | B2* | 5/2018 | Garelli | G06F 1/1656 |
| 9,989,995 | B2* | 6/2018 | Kwak | G06F 1/1643 |
| 10,527,877 | B2* | 1/2020 | Ochi | G06F 1/1637 |
| 10,791,206 | B2* | 9/2020 | Lee | H04M 1/0266 |
| 2012/0288661 | A1* | 11/2012 | Wei | C03B 23/03 |
| | | | | 428/64.1 |
| 2013/0241855 | A1 | 9/2013 | Kim | |
| 2014/0009914 | A1 | 1/2014 | Cho et al. | |
| 2015/0049428 | A1* | 2/2015 | Lee | G06F 1/1652 |
| | | | | 361/679.27 |
| 2015/0062480 | A1 | 3/2015 | Cho et al. | |
| 2015/0331451 | A1* | 11/2015 | Shin | H04M 1/0277 |
| | | | | 345/173 |
| 2016/0066440 | A1 | 3/2016 | Choi et al. | |
| 2016/0270209 | A1 | 9/2016 | Cho | |
| 2016/0299592 | A1* | 10/2016 | Kim | G06F 3/041 |
| 2016/0342231 | A1 | 11/2016 | Ai et al. | |
| 2016/0357052 | A1* | 12/2016 | Kim | H01L 51/5237 |
| 2017/0194580 | A1* | 7/2017 | Lee | H01L 51/5256 |
| 2017/0294495 | A1* | 10/2017 | Shyu | H01L 27/3276 |
| 2018/0053816 | A1 | 2/2018 | Choi et al. | |
| 2018/0061917 | A1 | 3/2018 | Kim et al. | |
| 2018/0097197 | A1* | 4/2018 | Han | G06F 1/1626 |

FOREIGN PATENT DOCUMENTS

| | | |
|---|---|---|
| CN | 104850183 A | 8/2015 |
| CN | 105551383 A | 5/2016 |
| CN | 105551384 A | 5/2016 |
| CN | 105977275 A | 9/2016 |
| CN | 106601133 A | 4/2017 |
| CN | 107068862 A | 8/2017 |
| CN | 107241881 A | 10/2017 |
| CN | 107689425 A | 2/2018 |
| CN | 107768540 A | 3/2018 |
| CN | 107799553 A | 3/2018 |
| CN | 108010921 A | 5/2018 |
| CN | 207491012 U | 6/2018 |

OTHER PUBLICATIONS

International Search Report & Written Opinion dated Apr. 10, 2019, regarding PCT/CN2018/116741.
First Office Action in the Chinese Patent Application No. 201810713487.6, dated Apr. 30, 2019; English translation attached.
Second Office Action in the Chinese Patent Application No. 201810713487.6, dated Sep. 18, 2019; English translation attached.

* cited by examiner

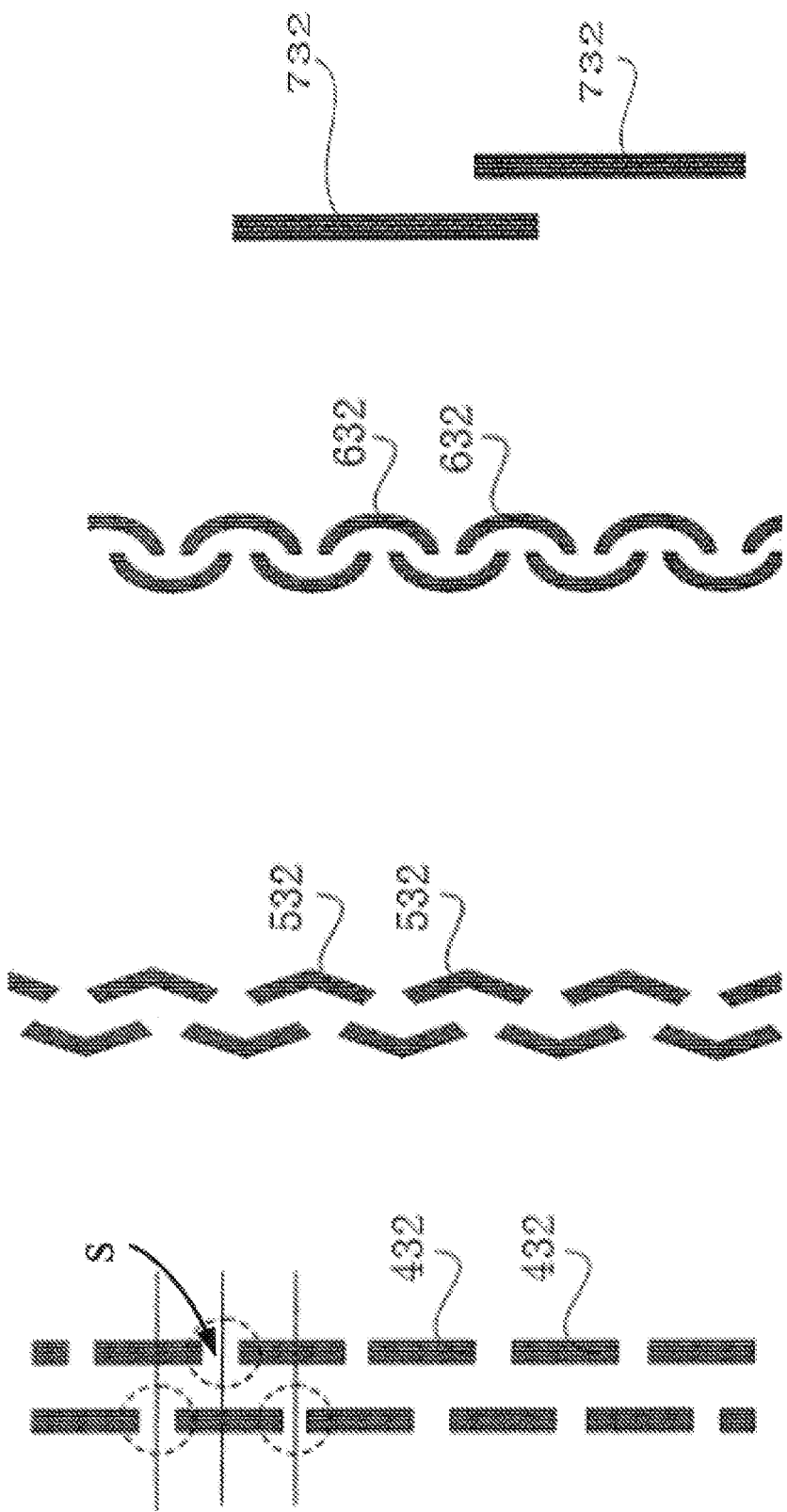

ELECTRONIC APPARATUS, SUPPORT FOR SUPPORTING FLEXIBLE DISPLAY PANEL IN ELECTRONIC APPARATUS, AND METHOD OF FABRICATING ELECTRONIC APPARATUS

CROSS-REFERENCE TO RELATED APPLICATION

This application is a national stage application under 35 U.S.C. § 371 of International Application No. PCT/CN2018/116741, filed Nov. 21, 2018, which claims priority to Chinese Patent Application No. 201810713487.6, filed Jun. 29, 2018, the contents of which are incorporated by reference in the entirety.

TECHNICAL FIELD

The present invention relates to an electronic apparatus, a support for supporting a flexible display panel in an electronic apparatus, and a method of fabricating an electronic apparatus.

BACKGROUND

A display panel is wildly used in lots of electronic devices, such as mobile phones, computers, game consoles, e-books, tablets, navigators, etc. The flexible display panels including organic light-emitting diode (OLED) display panels are flexible, therefore, they are suitable to be used in electronic devices in different occasions or with different types of users. Also, the flexible display panels can be used to form different structures of electronic devices.

SUMMARY

In one aspect, the present invention provides an electronic apparatus, comprising a flexible display panel and a support for supporting the flexible display panel, wherein the flexible display panel has a display area and a peripheral area, and an edge groove in the peripheral area defining an edge portion of the flexible display panel, the edge portion being on a side of the edge groove distal to the display area; wherein the support has a first support groove configured to receive the edge portion of the flexible display panel; and wherein the flexible display panel is bent about the edge groove, facilitating insertion of the edge portion of the flexible display panel into the first support groove.

Optionally, the support further comprises a second support groove adjacent to the first support groove, and on a side of the first support groove distal to a central area of the support.

Optionally, the electronic apparatus further comprises a cover glass; wherein an edge portion of the cover glass is inserted into the second support groove, thereby securing the cover glass on the support.

Optionally, the first support groove and the second support groove are directly adjacent to each other.

Optionally, the first support groove has a first side wall and a second side wall facing each other, and a third side wall connecting the first side wall and the second side wall; and the second support groove has a fourth side wall, and a fifth side wall connecting the fourth side wall and the first side wall of the first support groove.

Optionally, the edge groove is disposed on two opposing sides of the flexible display panel.

Optionally, the edge groove substantially surrounds the display area.

Optionally, the edge groove comprises a plurality rows of sub-edge grooves each having a plurality of sub-edge grooves; and any individual one of the plurality of sub-edge grooves in one row of the plurality rows of sub-edge grooves is misaligned with respect to the plurality of sub-edge grooves in an adjacent row of the plurality rows of sub-edge grooves.

Optionally, any individual one of the plurality of sub-edge grooves in one row of the plurality rows of sub-edge grooves is aligned with a space between adjacent sub-edge grooves of the plurality of sub-edge grooves in an adjacent row of the plurality rows of sub-edge grooves.

Optionally, the second side wall of the first support groove has a curved surface; and the edge portion of the flexible display panel curves about the curved surface of the second side wall, and in direct contact with the curved surface.

Optionally, the first support groove is curved along its depth direction; and the edge portion of the flexible display panel is curved along a depth direction of the first support groove.

Optionally, the flexible display panel further comprises a flexible material filled in the edge groove.

Optionally, the flexible display panel is a flexible organic light-emitting diode (OLED) display panel.

Optionally, the flexible organic light-emitting diode (OLED) display panel comprises a flexible base substrate and a plurality of functional layers disposed on the flexible base substrate; wherein the edge groove extends through the plurality of functional layers of the flexible display panel, exposing a surface of the flexible base substrate.

Optionally, the electronic apparatus is a mobile phone; the support is a middle flame of the mobile phone; and the electronic apparatus further comprises a back cover.

In another aspect, the present invention provides a support for supporting a flexible display panel in an electronic apparatus, comprising a first support groove; and a second support groove adjacent to the first support groove, and on a side of fire first support groove distal to a central area of the support.

Optionally, the first support groove and the second support groove are directly adjacent to each other; wherein the first support groove has a first side wall and a second side wall facing each other, and a third side wall connecting the first side wall and the second side wall; and the second support groove has a fourth side wall, and a fifth side wall connecting the fourth side wall and the first side wall.

Optionally, the second side wall of the first support groove has a curved surface.

Optionally, the first support groove having a curved shape along its depth direction.

In another aspect, the present invention provides a method of fabricating an electronic apparatus, comprising forming a flexible display panel having a display area and a peripheral area; forming a support for supporting the flexible display panel, and assembling the flexible display panel and the support together, wherein forming the flexible display panel comprises forming an edge groove in the peripheral area, the edge groove being formed to define an edge portion of the flexible display panel, the edge portion being on a side of the edge groove distal to the display area; wherein forming the support comprises forming a first support groove for receiving the edge portion of the flexible display panel; wherein assembling the flexible display panel and the support comprises bending the flexible display panel about the edge groove; and inserting the edge portion of the flexible display panel into the first support groove of the support thereby securing the flexible display panel on the support.

BRIEF DESCRIPTION OF THE FIGURES

The following drawings are merely examples for illustrative purposes according to various disclosed embodiments and are not intended to limit the scope of the present invention.

FIG. 9 is a schematic diagram illustrating a shape of an edge groove of a flexible display panel in some embodiments according to the present disclosure.

FIG. 10 is a schematic diagram illustrating a shape of an edge groove of a flexible display panel in some embodiments according to the present disclosure.

FIG. 11 is a schematic diagram illustrating a shape of an edge groove of a flexible display panel in some embodiments according to the present disclosure.

FIG. 12 is a schematic diagram illustrating a shape of an edge groove of a flexible display panel in some embodiments according to the present disclosure.

DETAILED DESCRIPTION

Figure 1:
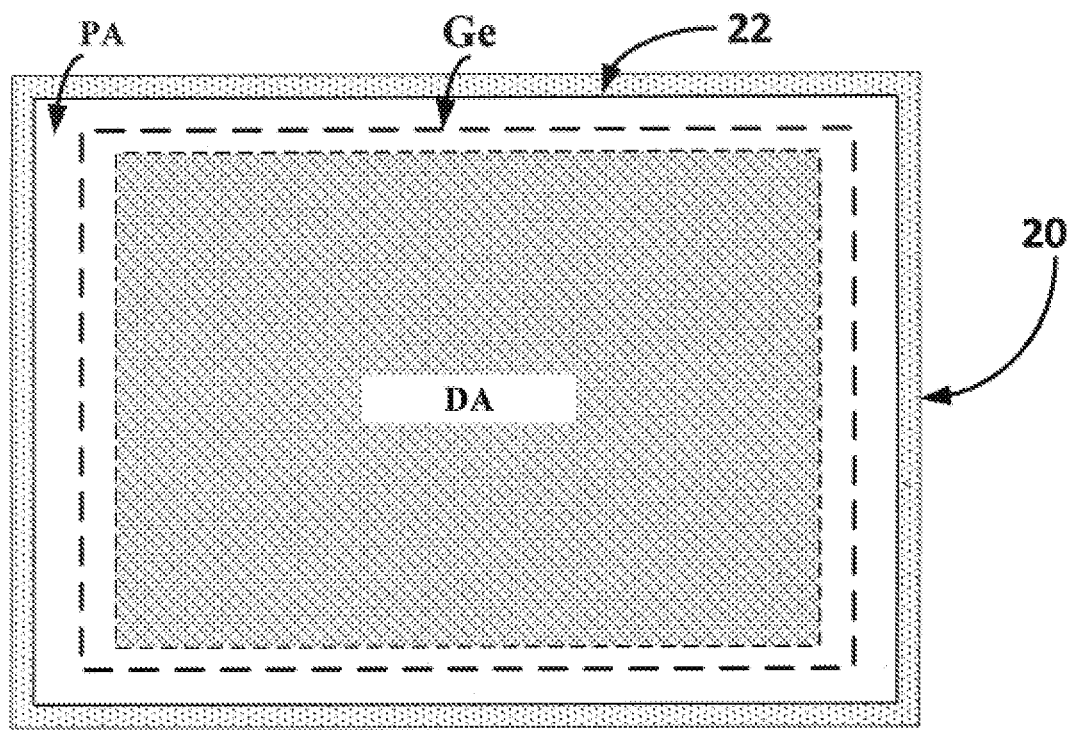
FIG. 1 is a plan view of an electronic apparatus in some embodiments according to the present disclosure.

The disclosure will now be described mere specifically with reference to the following embodiments. It is to be noted that the following descriptions of some embodiments are presented herein for purpose of illustration and description only. It is not intended to be exhaustive or to be limited to the precise form disclosed.

Cracks are easily formed on an edge of a flexible display panel when a force is applied to the edge of the flexible display panel. The cracks may be formed extending from the edge of the flexible display panel to the display area of the flexible display panel, forming growing dark spot (GDS) on the display area and influencing the display quality.

Accordingly, the present disclosure provides, inter alia, an electronic apparatus, a support for supporting a flexible display panel in an electronic apparatus, and a method of fabricating an electronic apparatus that substantially obviate one or more of the problems due to limitations and disadvantages of the related art. In one aspect, the present disclosure provides an electronic apparatus. In some embodiments, the electronic apparatus includes a flexible display panel and a support for supporting the flexible display panel. Optionally, foe flexible display panel has a display area and a peripheral area, and an edge groove in the peripheral area defining an edge portion of the flexible display panel, the edge portion being on a side of the edge groove distal to the display area. Optionally, the support has a first support groove configured to receive the edge portion of the flexible display panel. Optionally, the flexible display panel is bent about the edge groove, facilitating insertion of foe edge portion of the flexible display panel into the first support groove. The present disclosure increases the area of peripheral area of the flexible display panel, and decreases foe chance of forming growing dark spot on the display area without increasing the size of foe electronic device.

As used herein, the term "display area" refers to an area of a display panel where image is actually displayed. Optionally, the display area may include both a subpixel region and an inter-subpixel region. A subpixel region refers to a light emission region of a subpixel, such as a region corresponding to a pixel electrode in a liquid crystal display or a region corresponding to a light emissive layer in an organic light emitting diode display panel. An inter-subpixel region refers to a region between adjacent subpixel regions, such as a region corresponding to a black matrix in a liquid crystal display or a region corresponding a pixel definition layer in an organic light emitting diode display panel. Optionally, the inter-subpixel region is a region between adjacent subpixel regions in a same pixel. Optionally, the inter-subpixel region is a region between two adjacent subpixel regions from two adjacent pixels. As used herein the term "peripheral area" refers to an area of a display panel where various circuits and wires are provided to transmit signals to the display substrate. To increase the transparency of the display apparatus, non-transparent or opaque components of the display apparatus (e.g., battery, printed circuit board, metal frame), can be disposed in the peripheral area rather than in the display areas.

In some embodiments, an OLED display panel includes a display area and a peripheral area, the display area is in central of the display panel, and the peripheral area surrounds the display area. In some embodiments, interface circuits connecting with other devices are disposed on the peripheral area. In some embodiments, the peripheral area is used to provide fixation for the display devices. When a force is applied to the edge of the OLED display panel, for example, the bezel clamps the OLED display panel, or when the electronic apparatus is dropped, a force is applied to the edge of display panel, cracks are formed on the edge of the display panel (e.g. peripheral area). The cracks may extend towards the display area after forces are repeatedly applied to the edge of the OLED display panel, forming dark spot on the OLED display panel, which may reduce the display quality of the electronic apparatus having the OLED display penal.

Increasing the area of the peripheral area of a flexible display panel may reduce the chance that a crack propagates from the peripheral area to the display area of the flexible display panel. However, due to the fixed shape of a case of an electronic apparatus, the peripheral area of a display panel of the electronic apparatus cannot be increased without increasing the size of the case.

FIG. 1 is a plan view of an electronic apparatus in some embodiments according to the present disclosure. Referring to FIG. 1, an electronic apparatus 20 includes a flexible display panel 22. The flexible display panel 22 has a display area DA and a peripheral area PA. Optionally an edge groove Ge in the peripheral area defines an edge portion of the flexible display panel, and the edge portion is on a side of the edge groove Ge distal to the display area DA. Optionally, the edge portion can be bent. Optionally, the flexible display panel is an OLED display panel.

Figure 2:
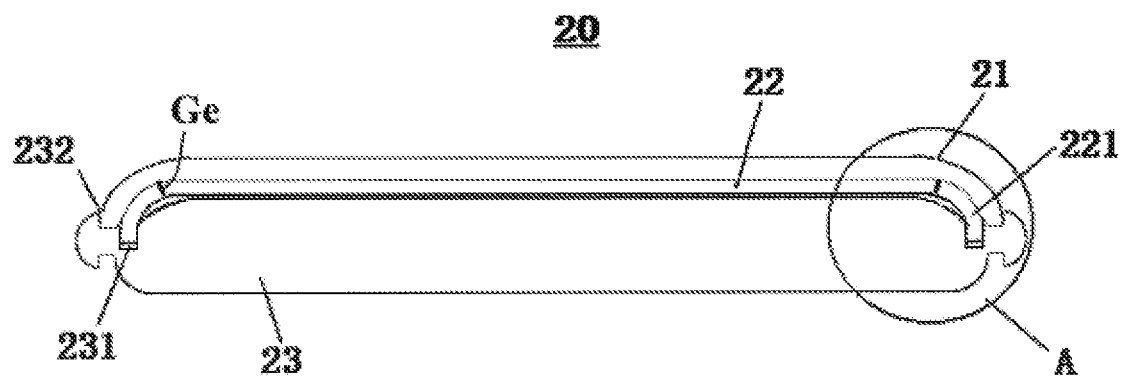
FIG. 2 is a cross-sectional view of an electronic apparatus in some embodiments according to the present disclosure.
Figure 3:
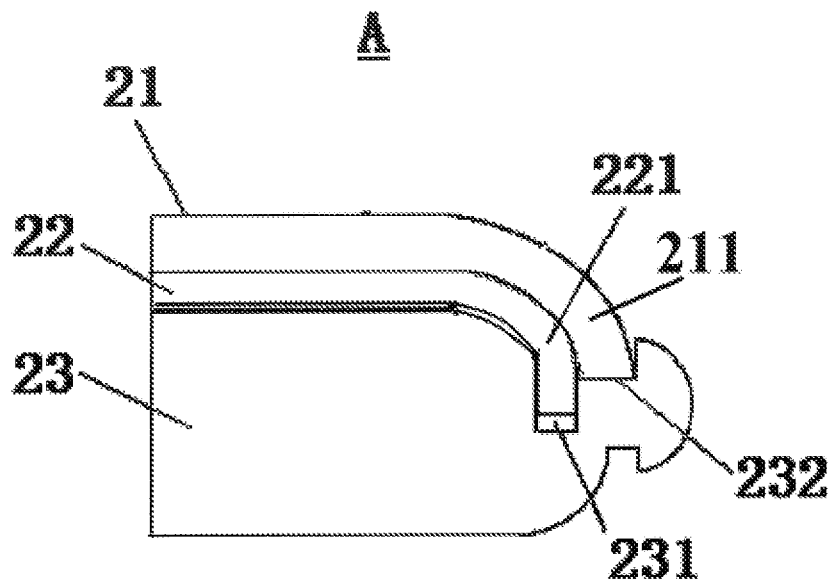
FIG. 3 is a zoom-in view of Part A of the electronic apparatus in FIG. 2.

FIG. 2 is a cross-sectional view of an electronic apparatus in some embodiments according to the present disclosure. FIG. 3 is a zoom-in view of Part A of the electronic apparatus in FIG. 2. Referring to FIG. 2, in some embodiments, the electronic apparatus 20 includes a support 23 far supporting the flexible display panel 22. Optionally, the support 23 can be a middle frame of the electronic apparatus 20. Referring to FIG. 2 and FIG. 3, the support 23 has a first support groove 231 configured to receive the edge portion 221 of the flexible display panel. Optionally, the support 23 further has a second support groove 232 adjacent to the first support groove 231, and the second support groove 232 is on a side of the first support groove 231 distal to a central area of the support 23. Referring to both FIG. 1 and FIG. 3, the flexible display panel 22 is bent about the edge groove GE, facilitating insertion of the edge portion 221 of the flexible display panel 22 into the first support groove 231.

In some embodiments, the electronic apparatus 20 further includes a cover glass 21 disposed on a side of the flexible display panel 22 distal to the support 23 to protect the flexible display panel 22. Optionally, the cover glass 21 is made of transparent glass. Optionally, an edge portion 211 of the cover glass 21 is inserted into the support 23. Optionally, an edge portion 211 of the cover glass 21 is inserted in the second support groove 232 to secure the cover glass 21 on the support 23.

Figure 4:
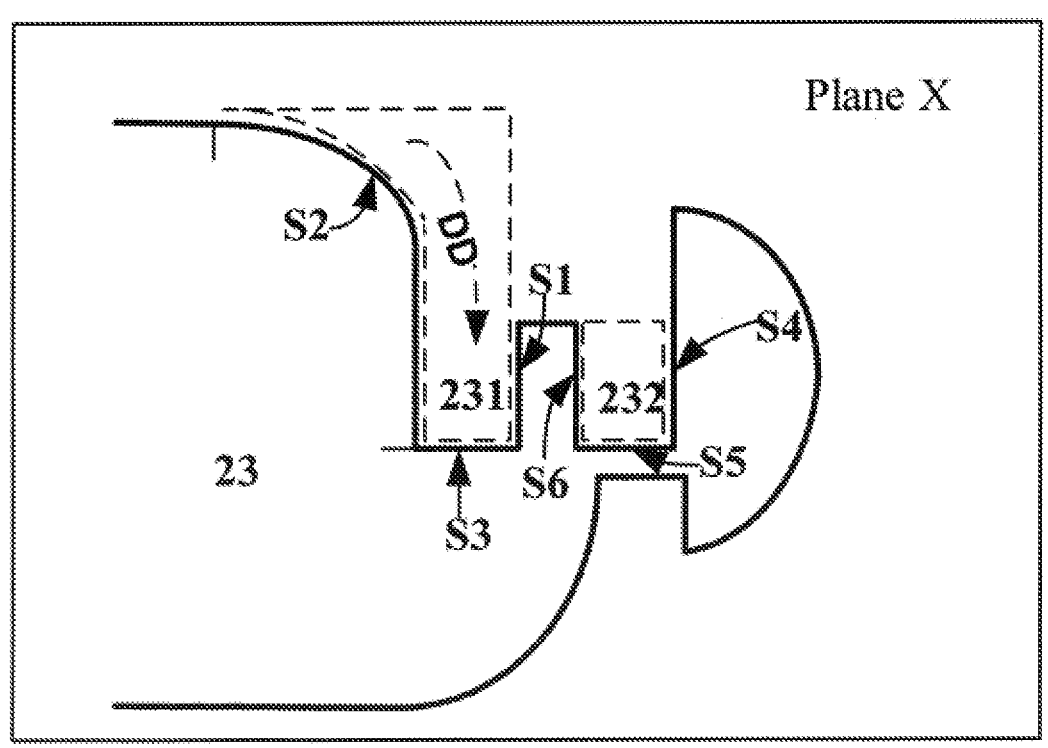
FIG. 4 is a partial cross-sectional view of a support for supporting a flexible display panel in some embodiments according to the present disclosure.

In another aspect, the present disclosure also provides a support for supporting a flexible display panel. FIG. 4 is a partial cross-sectional view of a support for supporting a flexible display panel in some embodiments according to the present disclosure. Referring to FIG. 4, a partial cross-sectional view is on a plane X perpendicular to the surface of the flexible display panel and parallel to a side of the flexible display panel. Referring to FIG. 4, a support 23 for supporting the flexible display panel has a first support groove 231 and a second support groove 232. The second support groove 232 is on a side of the first support groove 231 distal to a central area of the support 23. Optionally, the second support groove 232 is adjacent to (e.g., directly adjacent) the first support groove 231.

In some embodiments, the first support groove 231 has a first side wall S1 and a second side wall S2 facing each other, and a third side wall S3 connecting the first side wall S1 and the second side wall S2. Optionally, the second side wall S2 extends from one end of the third side wall S3 distal to the first side wall S1 to an upper surface of the support, wherein the upper surface is a surface for receiving a flexible display panel. Optionally, the second side wall S2 of the first support groove 231 has a curved surface. When the support 23 receives a flexible display panel, the edge portion of the flexible display panel curves about the curved surface of the second side wall S2, and optionally is in direct contact with the curved surface of the second side wall S2. Optionally, a shape of the cross-section of the first support groove 231 is a polygon with an opening. Optionally, a shape of the cross-section of the first support groove 231 is a rectangular with an opening. Optionally, the first support groove 231 has a shape complementary to the edge portion of the flexible display panel being inserted into the first support groove 231.

In some embodiments, the second support groove 232 has a fourth side wall S4 and a sixth side wall S6 facing each other, and a fifth side wall S5 connecting the fourth side wall S4 and the second side wall S6. Optionally, the sixth side wall S6 of the second support groove 232 has a curved surface. In one example, the edge portion of the cover glass curves about the curved surface of the sixth side wall S6 of the second support groove 232. Optionally, a shape of the cross section of the second support groove 232 is a polygon with an opening. Optionally, a shape of the cross-section of the second support groove 232 is a rectangular with an opening. Optionally, the second support grove 232 has a shape complementary to the edge portion of the cover glass being inserted into the second support groove 232.

Figure 5:
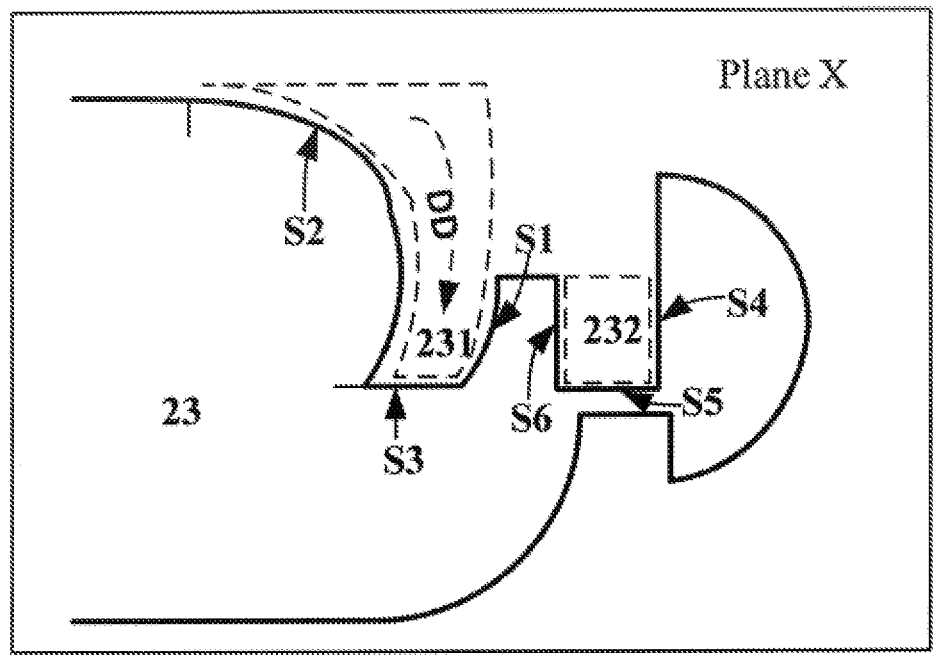
FIG. 5 is a partial cross-sectional view of a support for supporting a flexible display panel in some embodiments according to the present disclosure.

FIG. 5 is a partial cross-sectional view of a support for supporting a flexible display panel in some embodiments according to the present disclosure. Referring to FIG. 5, a partial cross-sectional view is on a plane X perpendicular to the surface of the flexible display panel and parallel to a side of the flexible display panel. In some embodiments, the first support groove 231 has a curved shape along its depth direction DD. In one example, the edge portion of the flexible display panel can be bent and inserted in to first support groove 231. Optionally, the first support groove 231 has a curved shape along a direction of the edge portion of the flexible display panel inserted in the first support groove 231.

Depth direction may refer to a direction substantially parallel with a direction the second side wall S2 extending in a direction from central part of the support 23 to an end of the third side wall S3 distal to the first side wall S1.

Figure 6:
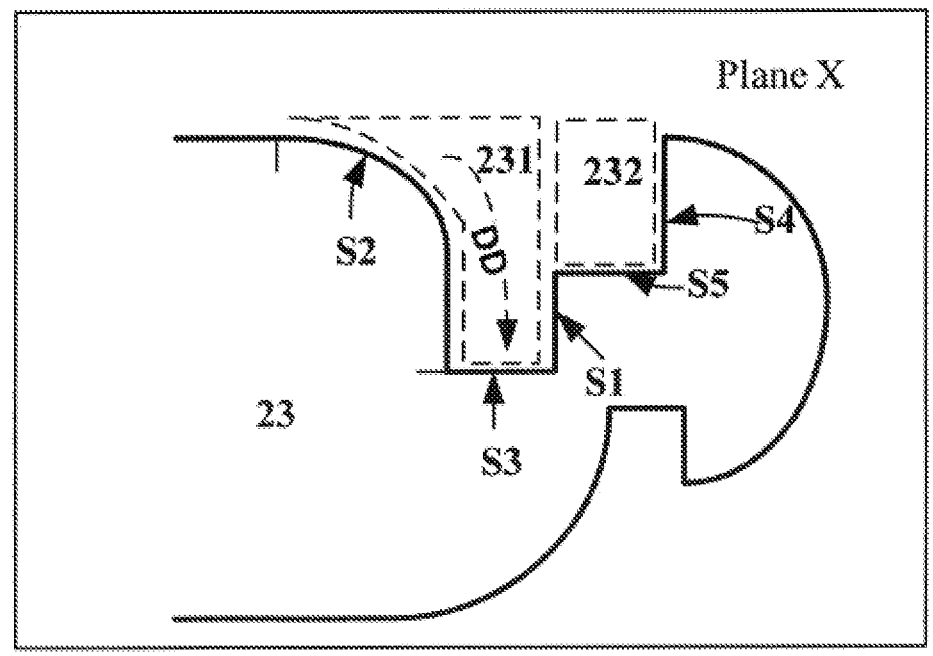
FIG. 6 is a partial cross-sectional view of a support for supporting a flexible display panel in some embodiments according to the present disclosure.

FIG. 6 is a partial cross-sectional view of a support for supporting a flexible display panel in some embodiments according to the present disclosure. Referring to FIG. 6, a partial cross-sectional view is on a plane X perpendicular to the surface of the flexible display panel and parallel to a side of the flexible display panel. in some embodiments, the first support groove 231 and the second support groove 232 are directly adjacent to each. In some embodiments, the first support groove 231 has a first side wall S1 and a second side wall S2 facing each other, and a third side wall S3 connecting the first side wall S1 and the second side wall S2. Optionally, the second side wall S2 extends from one end of the third side wall S3 distal to the first side wall S1 to an upper surface of the support, wherein the upper surface is a surface for receiving a flexible display panel. Optionally, the second side wall S2 of the first support groove 231 has a curved surface. In one example, the edge portion of the flexible display panel curves about the curved surface of the second side wall S2, and in direct contact with the curved surface of the second side wall S2. Optionally, the first support groove 231 has a complemental shape with respect to the edge portion of the flexible display panel being inserted into the first support groove 231.

In some embodiments, the second support groove 232 has a fourth side wall S4, and a fifth side wall S5 connecting the fourth side wall S4 and the first side wall S1. Optionally, the second support groove 232 has a shape complementary to the edge portion of the cover glass being inserted into the second support groove 232.

Figure 7:
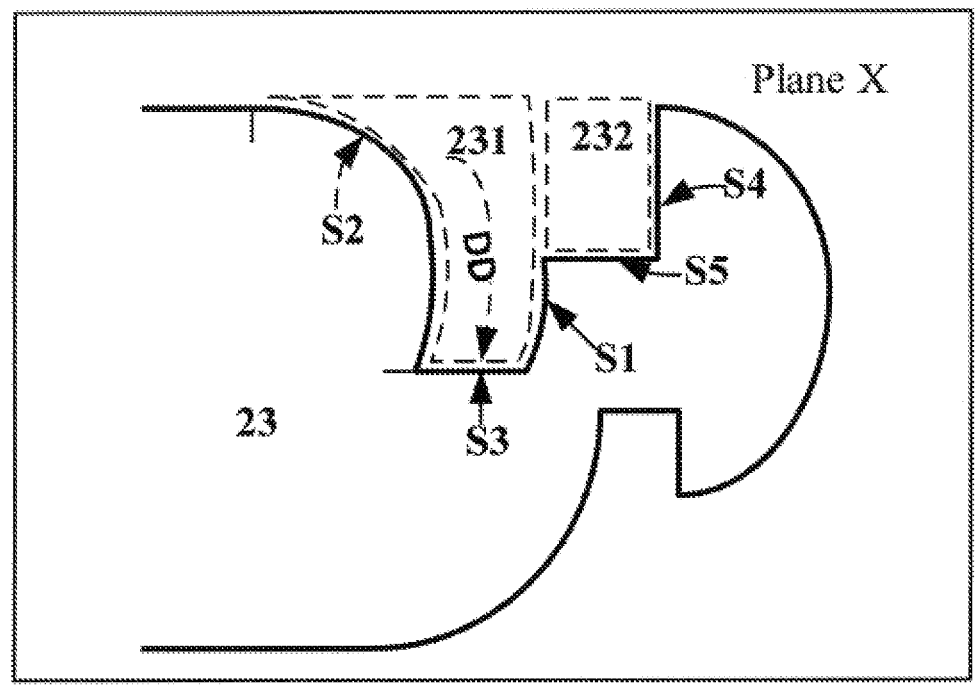
FIG. 7 is a partial cross-sectional view of a support for supporting a flexible display panel in some embodiments according to the present disclosure.

FIG. 7 is a partial cross-sectional view of a support for supporting a flexible display panel in some embodiments according to the present disclosure. Referring to FIG. 7, a partial cross-sectional view is on a plane X perpendicular to the surface of the flexible display panel and parallel to a side of the flexible display panel. In some embodiments, the first support groove 231 has a curved shape along a depth direction DD. In one example, the edge portion of the flexible display panel can be bent and inserted in to first support groove 231. Optionally, the first support groove 231 has a curved shape along a direction of the edge portion of the flexible display panel inserted in the first support groove 231.

Optionally, the first support groove 231 can be integrally molded with the support 23. Optionally, subsequent to forming the support 23, the first support groove 231 can be formed on the support 23 using milling.

Figure 8:
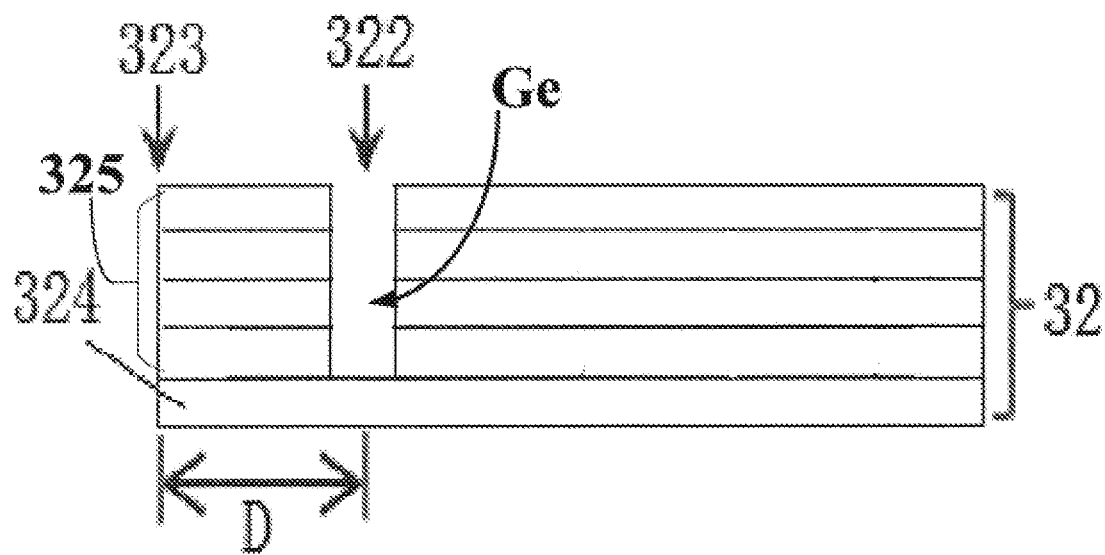
FIG. 8 is a partial cross-sectional view of a peripheral area of a flexible display panel in some embodiments according to the present disclosure.

FIG. 8 is a partial cross-sectional view of a peripheral area of a flexible display panel in some embodiments according to the present disclosure. Referring to FIG. 8, a flexible display panel 32 includes a flexible base substrate 324 and a plurality of functional layers 325 disposed on the flexible base substrate 324. Optionally, the flexible display panel 32 is an OLED display panel. As used herein, the term "functional layer" refers to a layer giving a desired property to the substrate and providing a certain effect. Various appropriate layers may be used as one of the plurality of function layers 325 disposed on the flexible base substrate 324. Examples of layers suitable to be used as one of the plurality of function layers 325 includes, but not limited to a pixel driving circuit layer, an anode layer, a hole transporting layer, a hole injection layer, an electron transport layer, an electron injection layer, an organic light emitting layer, a pixel defining layer, a cathode layer, and one or more encapsulating layers.

In some embodiments, a width of the edge portion of the flexible display panel is D. Optionally, D can be 2 mm. In some embodiments, during the process from trimming a mother substrate to forming a flexible display panel 32, a first cutting 322 is performed on the plurality of functional layers 325 of a mother substrate to form an edge groove Ge in the peripheral area of the flexible display panel 32. Optionally, the area defined by the edge groove Ge is substantially the same as an area of a flexible display panel of a conventional mobile phone. In some embodiments, referring to FIG. 8, the edge groove Ge of the flexible display panel 32 may be formed by etching the plurality of functional layers 325, so that the edge groove Ge extends through the plurality of functional layers 325 of the flexible display panel 32, exposing a surface of the flexible base substrate 324.

In some embodiments, a second cutting 323 is performed on the mother substrate on a position spaced apart from the edge groove Ge by a width D, to form the flexible display panel 32. Optionally, the second cutting 323 can be performed before the first cutting 322. Optionally, the second cutting 323 and the first cutting 322 may be formed in a same cutting process, e.g., substantially simultaneously.

Various appropriate methods may be used in the cutting process. Examples of methods suitable to be used in the cutting process include, but not limited to, lithography, and etching.

Referring to both FIG. 1 and FIG. 8, in some embodiments, the edge groove Ge of the flexible display panel 32 can be parallel to the edge of the flexible display panel 32 (e.g. an edge formed by performing the second cutting 323). Optionally, the edge groove Ge is disposed on two opposing sides of the flexible display panel 32. Optionally, the edge groove Ge substantially surrounds the display area of the flexible display panel 32. Optionally, the edge groove Ge is disposed on three of the four sides of the flexible display panel 32. As used herein, the term "substantially surround" refers to refers to surrounding at least 50% (e.g., at least 60%, at least 70%, at least 80%, at least 90%, at least 95%, at least 99%, and 100%) of a perimeter of an area (e.g. a display area).

In some embodiments, the edge groove Ge is disposed in order to prevent a crack on an edge of the flexible display panel 32 from propagating to the display area of the flexible display panel 32. Optionally, the edge groove Ge can be a single groove on a side of the flexible display panel 32, for example, a cutting groove. In one example, the edge groove Ge is parallel to the edge of the flexible display panel 32. In another example, the length of the edge groove Ge is greater than the length of the corresponding edge of the flexible display panel 32. Optionally, the edge groove Ge includes a plurality rows of sub-edge grooves, one of a plurality rows of sub-edge grooves has a plurality of sub-edge grooves.

FIG. 9 is a schematic diagram illustrating a shape of an edge groove of a flexible display panel in some embodiments according to the present disclosure. Referring to FIG. 9, in some embodiments, the edge groove Ge include two rows of the plurality of sub-edge grooves 432. Optionally, any individual one of the plurality of sub-edge grooves 432 in one row of the plurality rows of sub-edge grooves 432 is misaligned with respect to the plurality of sub-edge grooves 432 in an adjacent row of the plurality rows of sub-edge grooves 432. Optionally, any individual one of the plurality of sub-edge grooves 432 in one row of the plurality rows of sub-edge grooves 432 is aligned with a space s between adjacent sub-edge grooves of the plurality of sub-edge grooves 432 in an adjacent row of the plurality rows of sub-edge grooves 432. Optionally, any individual one of the plurality of sub-edge grooves 432 is a straight line.

FIG. 10 is a schematic diagram illustrating a shape of an edge groove of a flexible display panel in some embodiments according to the present disclosure. Referring to FIG. 10, in some embodiments, any individual one of the plurality of sub-edge grooves 532 has a polygonal line shape.

FIG. 11 is a schematic diagram illustrating a shape of an edge groove of a flexible display panel in some embodiments according to the present disclosure. Referring to FIG. 11, in some embodiments, any individual one of the plurality of sub-edge grooves 632 has a smoothly curved line shape.

FIG. 12 is a schematic diagram illustrating a shape of an edge groove of a flexible display panel in some embodiments according to the present disclosure. Referring to FIG. 12, toe edge groove Ge includes two sub-edge grooves (e.g., a total number of the plurality of sub-edge grooves 732 is two), each of which is parallel to a corresponding edge of the display panel. Optionally, a length of each of the plurality of sub-edge grooves 732 can be smaller than a length of the corresponding edge of the display panel. Optionally, one of the plurality of sub-edge grooves 732 misaligned with respect to another of the plurality of sub-edge grooves 732. Optionally, one of the plurality of sub-edge grooves 732 misaligned with respect to another of the plurality of sub-edge grooves 732, however, edge portions of two of the plurality of sub-edge grooves 732 are aligned with respect to each other.

Referring to FIG. 9 to FIG. 12, the edge groove is filled with a flexible material. Optionally, the flexible material is polyimide.

In some embodiments, the edge groove Ge formed at the edge of the flexible display panel may prevent the crack from propagating to the display area of the flexible display panel, and prevent the growing dark spot from forming. In some embodiments, the peripheral area of the flexible display panel increases, and the edge of the peripheral area is inserted into the first support groove, therefore, the size of the electronic apparatus formed with the flexible display panel is not increased.

In another aspect, the present disclosure also provides a method of fabricating an electronic apparatus. In some embodiments, the method of fabricating an electronic apparatus includes forming a flexible display panel having a display area and a peripheral area; forming a support for supporting the flexible display panel; and assembling the flexible display panel and the support together.

Figure 13:
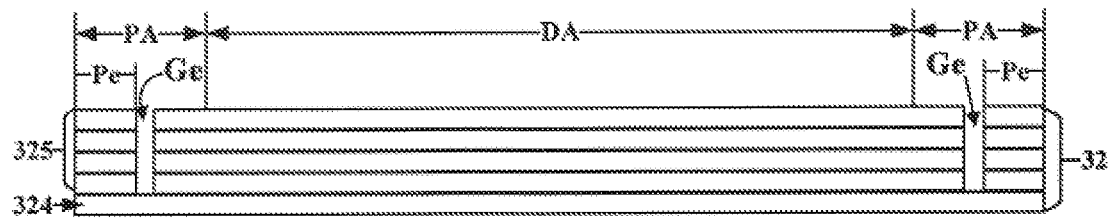
FIG. 13 is a schematic diagram showing a method of fabricating a flexible display panel in some embodiments according to the present disclosure.

FIG. 13 is a schematic diagram showing a method of fabricating a flexible display panel in some embodiments according to the present disclosure. Referring to FIG. 13, in some embodiments, forming the flexible display panel 32 includes forming an edge groove Ge in the peripheral area PA. In one example, the edge groove Ge is formed to define an edge portion Pe of the flexible display panel 32. In another example, the edge portion Pe is on a side of the edge groove Ge distal to the display area DA. Optionally, the edge groove Ge is formed on two opposing sides of the flexible display panel 32. Optionally, the edge groove Ge is formed to be substantially surrounding the display area DA.

In some embodiments, referring to FIG. 9 to FIG. 13, forming the edge groove Ge includes forming a plurality rows of sub-edge grooves 433 each having a plurality of sub-edge grooves 433. Optionally, the plurality rows of sub-edge grooves 433 are formed so that any individual one of the plurality of sub-edge grooves 433 in one row of the plurality rows of sub-edge grooves 433 is misaligned with respect to the plurality of sub-edge grooves 433 in an adjacent row of the plurality rows of sub-edge grooves 433. Optionally, the plurality rows of sub-edge grooves 433 are formed so that any individual one of the plurality of sub-edge grooves 433 in one row of the plurality rows of sub-edge grooves 433 is aligned with a space between adjacent sub-edge grooves of the plurality of sub-edge grooves 433 in an adjacent row of the plurality rows of sub-edge grooves 433. Optionally, forming a flexible display panel 32 further includes filling a flexible material in the sub-edge grooves.

In some embodiments, referring to FIG. 13, forming a flexible organic light-emitting diode (OLED) display panel includes forming a flexible base substrate 324; and forming a plurality of functional layers 325 on the flexible base substrate 324. Optionally, the edge groove Ge is formed to extend through the plurality of functional layers 325 of the flexible display panel 32, thereby exposing a surface of the flexible base substrate 324. Optionally, forming the edge groove Ge includes etching the plurality of functional layers 325 to expose a surface of the flexible base substrate 342.

Figure 14:
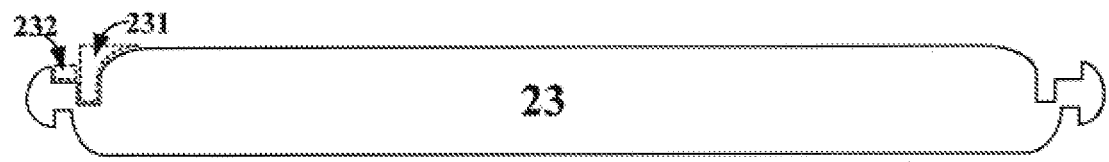
FIG. 14 is a schematic diagram showing a method of fabricating a support for supporting a flexible display panel in some embodiments according to the present disclosure.

FIG. 14 is a schematic diagram showing a method of fabricating a support for supporting a flexible display panel in some embodiments according to the present disclosure. Referring to FIG. 9, in some embodiments, forming the support 23 includes forming a first support groove 231 for receiving the edge portion of the flexible display panel. Optionally, forming the support 23 further includes forming a second support groove 232 on a side of the first support groove 231 distal to a central area of the support 23, the second support groove 232 is formed adjacent to the first support groove 231. Optionally, the second support groove 232 is formed directly adjacent to the first support groove 231.

In some embodiments, referring to both the FIG. 6 and FIG. 14, first support groove 231 is formed to have a first side wall S1 and a second side wall S2 feeing each other, and a third side wall S3 connecting the first side wall S1 and the second side wall S2. In some embodiments, the second support groove 232 is formed to have a fourth side wall S4, and a fifth side wall S5 connecting the fourth side wall S4 and the first side wall S1.

Figure 15:
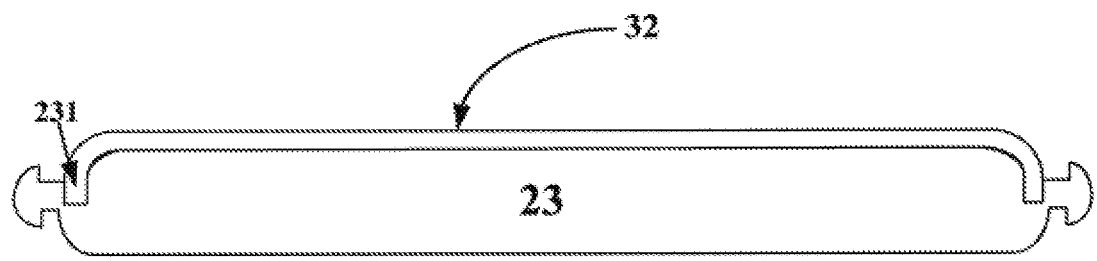
FIG. 15 is a schematic diagram showing a method of assembling a flexible display panel and a support in some embodiments according to the present disclosure.

FIG. 15 is a schematic diagram showing a method of assembling a flexible display panel and a support in some embodiments according to the present disclosure. Referring to FIG. 15, in some embodiments, assembling the flexible display panel 32 and the support 23 includes bending the flexible display panel 32 about the edge groove Ge; and inserting the edge portion Pe of the flexible display panel 32 into the first support groove 231 of the support to secure the flexible display panel 32 on the support 23.

Figure 16:
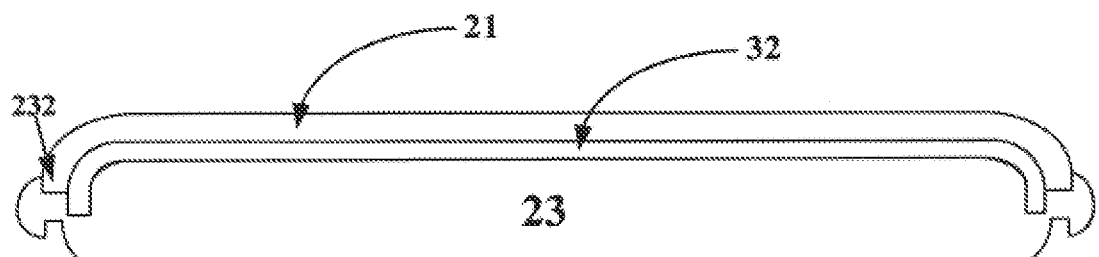
FIG. 16 is a schematic diagram showing a method of assembling a cover glass on an electronic apparatus in some embodiments according to the present disclosure.

FIG. 16 is a schematic diagram showing a method of assembling a cover glass on an electronic apparatus in some embodiments according to the present disclosure. Referring to FIG. 16, in some embodiments, the method of fabricating an electronic apparatus further includes providing a cover glass 21; and inserting an edge portion of the cover glass 21 into the second support groove 232 thereby securing the cover glass 21 on the support.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. An electronic apparatus, comprising a cover glass, a flexible display panel, and a support for supporting the flexible display panel;

wherein the flexible display panel has a display area and a peripheral area, and an edge groove in the peripheral area defining an edge portion of the flexible display panel, the edge portion being on a side of the edge groove distal to the display area;
wherein the support has a first support groove configured to receive the edge portion of the flexible display panel, a second support groove adjacent to the first support groove, and on a side of the first support groove distal to a central area of the support, and a barrier extending away from bottoms of the first support groove and the second support groove, separating at least a portion of the first support groove and at least a portion of the second support groove; and
the flexible display panel is bent about the edge groove; wherein an edge portion of the cover glass is inserted into the second support groove.

2. The electronic apparatus of claim 1, wherein the barrier extends away from the bottoms of the first support groove and the second support groove along a direction substantially perpendicular to the bottoms of the first support groove and the second support groove.

3. The electronic apparatus of claim 1, wherein the first support groove and the second support groove are directly adjacent to each other.

4. The electronic apparatus of claim 1, wherein the first support groove has a first side wall and a second side wall facing each other, and a third side wall connecting the first side wall and the second side wall;
the second support groove has a fourth side wall and a sixth side wall, and a fifth side wall connecting the fourth side wall and the sixth side wall;
the barrier extends away from the third side wall and the fifth side wall; and
the first side wall and the sixth side wall are two opposite side walls of the barrier.

5. The electronic apparatus of claim 4, wherein the edge groove substantially surrounds the display area.

6. The electronic apparatus of claim 4, wherein the second side wall of the first support groove has a curved surface; and
the edge portion of the flexible display panel curves about the curved surface of the second side wall, and in direct contact with the curved surface.

7. The electronic apparatus of claim 1, wherein the edge groove is disposed on two opposing sides of the flexible display panel.

8. The electronic apparatus of claim 1, wherein the edge groove comprises a plurality rows of sub-edge grooves each having a plurality of sub-edge grooves; and
any individual one of the plurality of sub-edge grooves in one row of the plurality rows of sub-edge grooves is misaligned with respect to the plurality of sub-edge grooves in an adjacent row of the plurality rows of sub-edge grooves.

9. The electronic apparatus of claim 8, wherein any individual one of the plurality of sub-edge grooves in one row of the plurality rows of sub-edge grooves is aligned with a space between adjacent sub-edge grooves of the plurality of sub-edge grooves in an adjacent row of the plurality rows of sub-edge grooves.

10. The electronic apparatus of claim 1, wherein the first support groove is curved along its depth direction; and
the edge portion of the flexible display panel is curved along a depth direction of the first support groove.

11. The electronic apparatus of claim 1, wherein the flexible display panel further comprises a flexible material filled in the edge groove.

12. The electronic apparatus of claim 1, the flexible display panel is a flexible organic light-emitting diode (OLED) display panel.

13. The electronic apparatus of claim 12, the flexible organic light-emitting diode (OLED) display panel comprises a flexible base substrate and a plurality of functional layers disposed on the flexible base substrate;
wherein the edge groove extends through the plurality of functional layers of the flexible display panel, exposing a surface of the flexible base substrate.

14. The electronic apparatus of claim 1, wherein the electronic apparatus is a mobile phone;
the support is a middle frame of the mobile phone; and
the electronic apparatus further comprises a back cover.

15. A support for supporting a flexible display panel in an electronic apparatus, comprising:
a first support groove;
a second support groove adjacent to the first support groove, and on a side of the first support groove distal to a central area of the support; and
a barrier extending away from bottoms of the first support groove and the second support groove, separating at least a portion of the first support groove and at least a portion of the second support groove;
wherein the first support groove receives an edge portion of a flexible display panel having an edge groove in a peripheral area defining the edge portion, the edge portion being on a side of the edge groove distal to a display area of the flexible display panel;
the second support groove is receives an edge portion of a cover.

16. The support in the electronic apparatus of claim 15, wherein the first support groove and the second support groove are directly adjacent to each other;
wherein the first support groove has a first side wall and a second side wall facing each other, and a third side wall connecting the first side wall and the second side wall; and
the second support groove has a fourth side wall and a sixth side wall, and a fifth side wall connecting the fourth side wall and the sixth side wall;
the barrier extends away from the third side wall and the fifth side wall; and
the first side wall and the sixth side wall are two opposite side walls of the barrier.

17. The support in the electronic apparatus of claim 16, wherein the second side wall of the first support groove has a curved surface.

18. The support in the electronic apparatus of claim 15, wherein the first support groove having a curved shape along its depth direction.

19. A method of fabricating an electronic apparatus, comprising:
forming a flexible display panel having a display area and a peripheral area;
forming a support for supporting the flexible display panel;
assembling the flexible display panel and the support together; and
providing a cover glass;
wherein forming the flexible display panel comprises forming an edge groove in the peripheral area, the edge groove being formed to define an edge portion of the flexible display panel, the edge portion being on a side of the edge groove distal to the display area;
wherein forming the support comprises forming a first support groove for receiving the edge portion of the flexible display panel, forming a second support groove adjacent to the first support groove, and on a side of the first support groove distal to a central area of the support, and forming a barrier extending away from bottoms of the first support groove and the second support groove, separating at least a portion of the first support groove and at least a portion of the second support groove;

wherein assembling the flexible display panel and the support comprises:

bending the flexible display panel about the edge groove; and inserting the edge portion of the flexible display panel into the first support groove of the support thereby securing the flexible display panel on the support;

wherein the method further comprises inserting an edge portion of the cover glass into the second support groove.

* * * * *